(12) United States Patent
Kim

(10) Patent No.: US 9,423,454 B2
(45) Date of Patent: Aug. 23, 2016

(54) TEST CIRCUIT AND SEMICONDUCTOR APPARATUS INCLUDING THE SAME

(71) Applicant: SK hynix Inc., Icheon-si Gyeonggi-do (KR)

(72) Inventor: Ki Up Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 104 days.

(21) Appl. No.: 14/279,457

(22) Filed: May 16, 2014

(65) Prior Publication Data

US 2015/0234010 A1  Aug. 20, 2015

(30) Foreign Application Priority Data

Feb. 18, 2014  (KR) .................. 10-2014-0018193

(51) Int. Cl.
| | |
|---|---|
| *G01R 31/28* | (2006.01) |
| *G01R 31/317* | (2006.01) |
| *G01R 31/3187* | (2006.01) |
| *G11C 29/36* | (2006.01) |
| *G01R 31/3185* | (2006.01) |

(52) U.S. Cl.
CPC ...... *G01R 31/31703* (2013.01); *G01R 31/3187* (2013.01); *G11C 29/36* (2013.01); *G01R 31/318513* (2013.01); *G11C 2029/3602* (2013.01)

(58) Field of Classification Search
CPC ............ G01R 31/31703; G01R 31/3187; G01R 31/318513; G11C 29/36
See application file for complete search history.

(56) References Cited

U.S. PATENT DOCUMENTS

| | | | | |
|---|---|---|---|---|
| 6,505,317 B1 * | 1/2003 | Smith | ............ | G01R 31/318505 714/724 |
| 7,607,055 B2 * | 10/2009 | Jung | .................. | G11C 29/1201 365/200 |
| 2006/0195742 A1 * | 8/2006 | Jung | .................. | G11C 29/1201 714/733 |
| 2006/0282722 A1 * | 12/2006 | Co | ........................ | G11C 29/56 714/724 |
| 2013/0002272 A1 * | 1/2013 | Badaroglu | ..... | G01R 31/318513 324/750.01 |

FOREIGN PATENT DOCUMENTS

KR  1020030022780 A  3/2003

* cited by examiner

*Primary Examiner* — Bryce Bonzo
*Assistant Examiner* — Thien D Nguyen
(74) *Attorney, Agent, or Firm* — William Park & Associates Ltd.

(57) ABSTRACT

A test circuit of a semiconductor apparatus includes a plurality of pads, a pattern generator configured to generate at least one internal test pattern in response to at least one pattern select signal, and a plurality of test units configured to transmit the at least one internal test pattern through the plurality of pads in response to a self test mode signal, and to compare the at least one test pattern received via the plurality of pads with the at least one generated internal test pattern and generate at least one test determination value based on the comparison.

16 Claims, 6 Drawing Sheets

TEST CIRCUIT AND SEMICONDUCTOR APPARATUS INCLUDING THE SAME

CROSS-REFERENCES TO RELATED APPLICATION

The present application claims priority under 35 U.S.C. §119(a) to Korean application number 10-2014-0018193, filed on Feb. 18, 2014, in the Korean Intellectual Property Office, which is incorporated herein by reference in its entirety.

BACKGROUND

1. Technical Field

Various embodiments relate to a semiconductor circuit, and more particularly, to a test circuit and a semiconductor apparatus including the same.

2. Related Art

As the integration degree of a semiconductor apparatus, for example a semiconductor memory, increases it may be desirable to increase the capacity of a single package.

In many cases, a multi-chip package may be used. Multiple chips are often arranged in a stacked configuration in a multi-chip package. During the manufacturing process of a multi-chip package, multiple chips are typically arranged in the stacked configuration prior to the packaging process.

The stacked chips may be electrically coupled via signal transmission elements. Examples of signal transmission elements may include, through vias and bump pads (hereinafter, referred to as 'bumps'). A through-silicon via (TSV) is an example of a through via.

SUMMARY

In an embodiment, a test circuit of a semiconductor apparatus may include a plurality of pads, a pattern generator configured to generate at least one internal test pattern in response to at least one pattern select signal, and a plurality of test units configured to transmit the at least one internal test pattern through the plurality of pads in response to a self test mode signal, and to compare the at least one test pattern received via the plurality of pads with the at least one generated internal test pattern and generate at least one test determination value based on the comparison.

In an embodiment, a semiconductor apparatus may include a plurality of slices electrically coupled to one another via a plurality of signal transmission elements, wherein, upon entry to a first test mode, a first one of the plurality of slices is configured to transmit at least one internal test pattern generated at the first one of the plurality of slices to the other plurality of slices through a plurality of pads, and wherein the each of the other plurality of slices is configured to compare the at least one internal test pattern received from the first one of the plurality of slices with at least one of the test patterns generated internally at that slice, to generate at least one test determination value and to transmit the at least one test determination value to an external system.

DETAILED DESCRIPTION

Embodiments of a test circuit and a semiconductor apparatus including the same will be described below with reference to the accompanying drawings.

Figure 1:
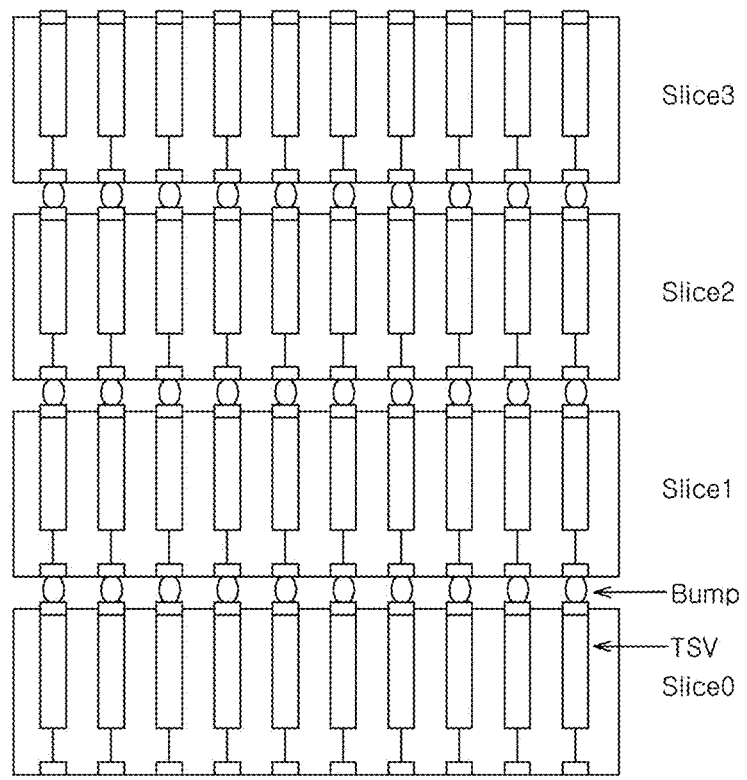
FIG. 1 is a cross-sectional view showing the configuration of an embodiment of a semiconductor apparatus.

As shown in FIG. 1, an embodiment of a semiconductor apparatus 100 may include a plurality of chips (hereinafter, referred to as 'slices') Slice0 to-Slice3. The plurality of chips are arranged in a stacked configuration.

The plurality of slices Slice0 to-Slice3 may be electrically coupled to one another via a plurality of signal transmission elements.

Examples of signal transmission elements may include, but are not limited to, through vias, through-silicon vias TSV and bump pads Bump (hereinafter, referred to as 'bumps').

A plurality of through-silicon-vias TSV may be formed in each of the plurality of slices Slice0-Slice3.

The plurality of slices Slice0-Slice3, may be electrically coupled to each other using through-silicon vias TSV. A through-silicon via of an overlying slice may be electrically coupled to a through-silicon via TSV of an underlying slice through one or more bumps Bump.

The lowermost slice Slice0 may be electrically coupled to a memory controller. Examples of memory controllers include, but are not limited to, a CPU, a GPU and test equipment.

An embodiment of the semiconductor apparatus 100 may include a test circuit configured to test whether the through-silicon vias TSV and bumps Bump have been properly configured. An example of a test circuit is a boundary scan test circuit.

Figure 2:
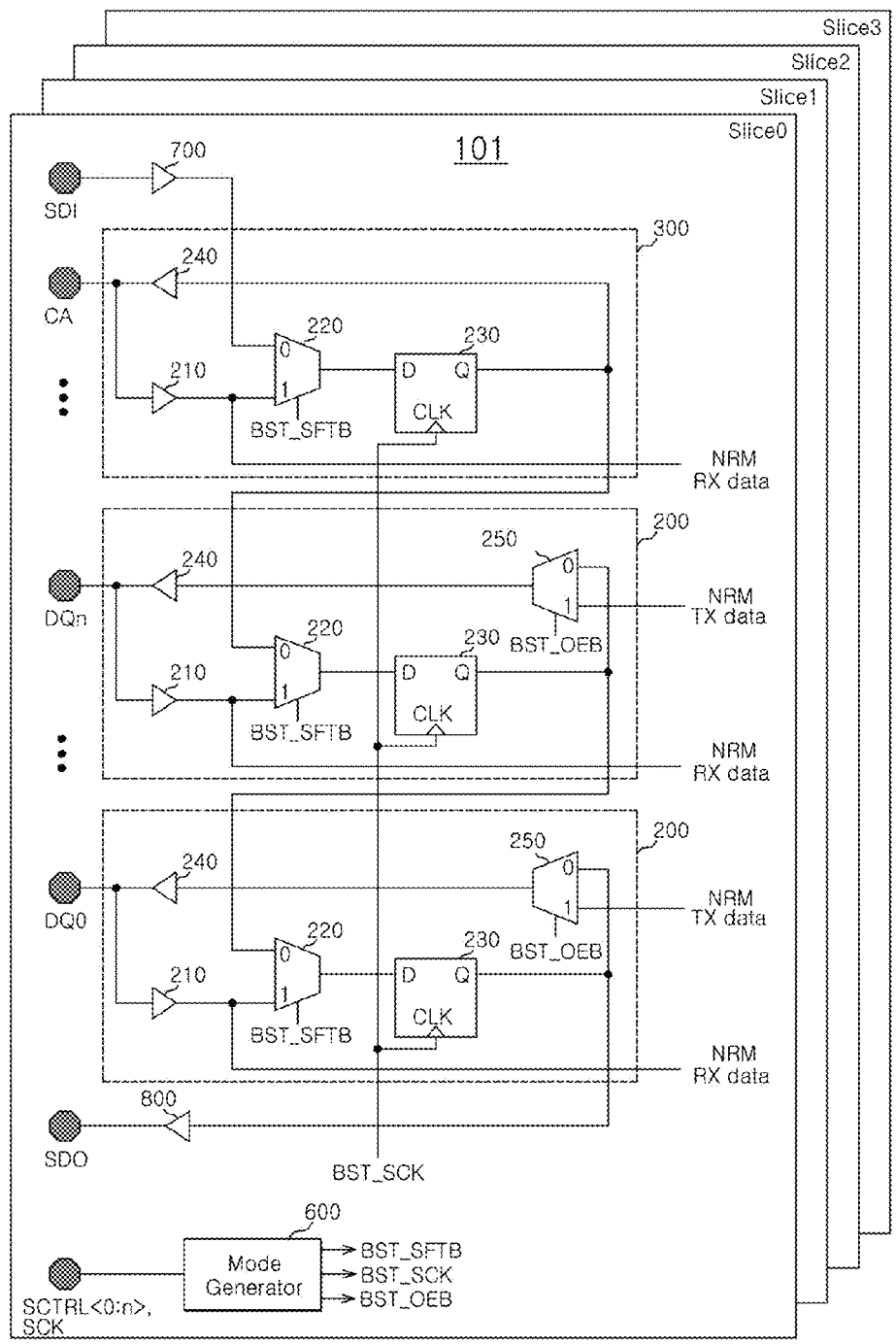
FIG. 2 is a block diagram representation of an embodiment of a test circuit.

As shown in FIG. 2, each of the plurality of slices Slice0-Slice3 may include an embodiment of a test circuit 101.

The test circuit 101 may include a plurality of pads SDI, CA, DQ<0:n>, SDO, SCTRL<0:n>, SCK, a plurality of test units 200, 300, a mode generator 600, an input buffer 700, and an output buffer 800.

Each of the plurality of pads SDI, CA, DQ<0:n>, SDO, SCTRL<0:n>, SCK of a slice Slice0-Slice3 may be electrically coupled to the corresponding pad SDI, CA, DQ<0:n>, SDO, SCTRL<0:n>, SCK of another slice Slice0-Slice3 using a bump Bump.

The plurality of pads SDI, CA, DQ<0:n>, SDO, SCTRL<0:n>, SCK may include, but is not limited to, a serial data input pad SDI, a command/address pad CA, input/output pads DQ<0:n>, a serial data output pad SDO, and control pads SCTRL<0:n>, SCK.

The test circuit 101 may include a plurality of command/address pads CA. The test circuit 101 may include a plurality of test units 200, 300.

The mode generator 600 may be configured to generate a plurality of test mode control signals in response to one or more signals received from one or more external devices and a clock signal received via the control pads SCTRL<0:n>, SC. The plurality of test mode control signals may include a first test mode control signal BST_SFTB, a second test mode control signal BST_OEB and a test clock signal BST_SCK.

The input buffer 700 may be configured to transmit the serial data received via the serial data input pad SDI to the test unit 300.

The output buffer 800 may be configured to transmit the data generated by the test unit 200 to the serial data output pad SDO.

The plurality of test units 200, 300 may be configured to store the test data received via the serial data input pad SDI or via the plurality of command/address pads CA, and data input/output pads DQ<0:n>in response to the first test mode control signal BST_SFTB and the test clock signal BST_SCK.

The plurality of test units 200, 300 may be configured to to transmit stored test data to an external device in response to the first test mode control signal BST_SFTB and the test clock signal BST_SCK. The plurality of test units 200, 300 may be configured to transmit stored test data to another slice via the plurality of command/address pads CA and data input/output pads DQ<0:n>in response to the second test mode control signal BST_OEB.

The plurality of test units 200, 300 may each include an input buffer 210, an output buffer 240, a first multiplexer 220, and a flip-flop 230. The plurality of test units 200 may include a second multiplexer 250.

The input buffer 210 may be configured to transmit one or more signals received via the data input/output pad DQ to the first multiplexer 220.

The first multiplexer 220 may be configured to select an output signal generated by an upper test unit 300, 200 or an output signal generated by the input buffer 210 in response to the first test mode control signal BST_SFTB.

The flip-flop 230 may be configured to store an output signal generated by the first multiplexer 220 in response to the test clock signal BST_SCK, and to transmit the output signal received from the first multiplexer to a lower test unit 200.

The second multiplexer 250 may be configured to select one of the output signal of the flip-flop 230 and normal mode transmission data (read data) NRM TX data in response to the second test mode control signal BST_OEB and to transmit the selected one of the output signal of the flip-flop 230 and normal mode transmission data (read data) NRM TX data to the output buffer 240.

The output buffer 240 may be configured to transmit the output signal received from the second multiplexer 250 to the data input/output pad DQ.

The plurality of test units 200, 300 may each include an input buffer 210, an output buffer 240, a first multiplexer 220, and a flip-flop 230. The plurality of test units 200 include an additional multiplexer, the second multiplexer 250.

The test unit 300 is electrically coupled with the command/address pad CA. Since the plurality of slices Slice0-Slice3 may not transmit commands/addresses to an external device, the test unit 300 may not include the second multiplexer 250.

The plurality of test units 300 may each include an input buffer 210, an output buffer 240, a first multiplexer 220, and a flip-flop 230.

The input buffer 210 may be configured to transmit signals received via the command/address pad CA to the first multiplexer 220.

In a normal operation mode, the output of the input buffer 210 may be a command/address and may be transmitted as normal mode reception data NRM RX data to an internal circuit configuration (not shown).

The first multiplexer 220 may be configured to select one of an output signal of the input buffer 700 and an output signal of the input buffer 210 in response to the first test mode control signal BST_SFTB.

The flip-flop 230 may be configured to store an output signal received from the first multiplexer 220 in response to the test clock signal BST_SCK and to shift or transmit the stored signal to a lower test unit 200.

The output buffer 240 may be configured to transmit an output signal received from the flip-flop 230 to the command/address pad CA.

Test operations of an embodiment of the test circuit 101 in will be described below.

When operating in a test mode, such as for example a boundary scan test mode, a serial test data storage operation is performed. The first test mode control signal BST_SFTB and the second test mode control signal BST_OEB may transition to different levels in accordance with the test mode.

During the performance of the serial test data storage operation, the test data received via the serial data input pad SDI may be stored in one or more of the flip-flops 230 of one of the plurality of slices Slice0-Slice3. For example, the received test data may be stored in the flip-flops 230 of the lowermost slice Slice0.

The test data received from an external device via the serial data input pad SDI of the lowermost slice Slice0 is stored in the flip-flop 230 of the test unit 300 in response to the first test mode control signal BST_SFTB and the test clock signal BST_SCK. The first test to mode control signal BST_SFTB may, for example, have a low level.

As the test clock signal BST_SCK toggles, the data latched in the flip-flop 230 of the test unit 300 is sequentially transmitted to the lower test units 200 and is stored in the corresponding flip-flops 230.

Upon the completion of the serial test data storage operation associated with storing test data in the flip-flops 230 of the test units 300, 200, a parallel test data generation operation is performed.

The parallel test data generation operation involves the transmission of the data stored in the flip-flops 230 of the lowermost slice Slice0 to the upper slices Slice1-Slice3 via he plurality of command/address pads CA and data input/output pads DQ<0:n>.

The test data stored in the flip-flops 230 of the lowermost slice Slice0 may be transmitted to the upper slices Slice1-Slice3 through the plurality of command/address pads CA and the data input/output pads DQ<0:n>via the second multiplexers 250 and the output buffers 240 in response to the second test mode control signal BST_OEB.

The upper slices Slice1-Slice3 store the test data received via the plurality of command/address pads CA and data input/output pads DQ<0:n> in the flip-flops 230 in response to the first test mode control signal BST_SFTB and the test clock signal BST_SCK. The first test mode control signal BST_SFTB may, for example, have a high level.

All of the slices or any one slice of the upper slices Slice1-Slice3 sequentially shift the test data stored in the flip-flops 230 in response to the first test mode control signal BST_SFTB and the test clock signal BST_SCK, and outputs the test data to an external device via through the serial data output pad SDO. The external device is external to the semiconductor apparatus. The first test mode control signal BST_SFTB may, for example, have a low level.

When the serial data output pads SDO of the plurality of slices Slice0-Slice3 are individually electrical coupled to an external device, the upper slices Slice1-Slice3 may substantially simultaneously output test data via the serial data output pads SDO. Examples of external devices include, but are not limited test equipment and a memory controller.

When the serial data output pads SDO of the plurality of slices Slice0-Slice3 are commonly electrically coupled to an external device, a slice selected from among the upper slices Slice1-Slice3 may output test data via the serial data output pad SDO.

Since the external device or external system supplies the semiconductor device with the test data, the external device may determine whether through-silicon TSV vias and bumps Bump have passed or failed the test operation based on a comparison of the values of the test data supplied to the semiconductor device with the values of the test data received via the serial data output pads SDO.

Figure 3:
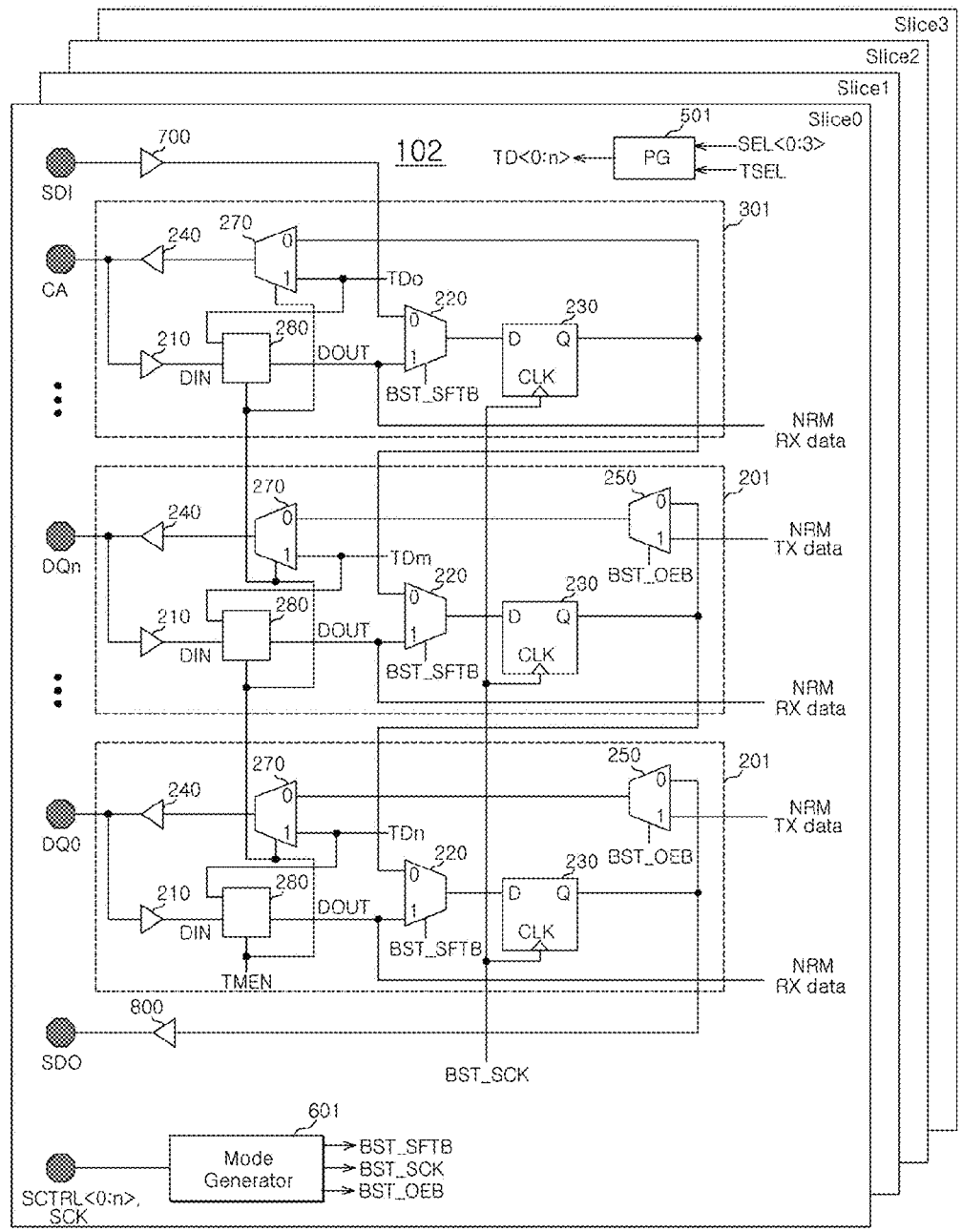
FIG. 3 is a block diagram representation of an embodiment of a test circuit.

As shown in FIG. 3, each of the plurality of slices Slice0-Slice3 may include an embodiment of a test circuit 102.

The test circuit 102 is configured to be placed in a first test mode and in a second test mode. The first test mode is a self test mode, and the second test mode is a test mode performed using the serial data input pad SDI shown in FIG. 2.

The self test mode enables testing using internally is generated test patterns and generating the test results based on such testing.

The test circuit 102 may include a plurality of pads SDI, CA, DQ<0:n>, SDO, SCTRL<0:n>, SCK, a plurality of test units 201, 301, a pattern generator 501, a mode generator 601, an input buffer 700, and an output buffer 800.

Each of the plurality of pads SDI, CA, DQ<0:n>, SDO, SCTRL<0:n>, SCK of a slice Slice0-Slice3 may be electrically coupled to a corresponding pad SDI, CA, DQ<0:n>, SDO, SCTRL<0:n>, SCK of another slice Slice0-Slice3 via a bump Bump.

The plurality of pads SDI, CA, DQ<0:n>, SDO, SCTRL<0:n>, SCK includes a serial data input pad SDI, a command/address pad CA, data input/output pads DQ<0:n>, a serial data output pad SDO, and control pads SCTRL<0:n>, SCK.

The test circuit 102 may include a plurality of command/address pads CA.

The pattern generator (PG) 501 may be configured to generate different types of test patterns TD<0:n> in response to first pattern select signals SEL<0:3> and a second pattern select signal TSEL.

The mode generator 601 may be configured to generate a plurality of test mode control signals in response to one or more signals received from an external device and a clock signal received via the control pads SCTRL<0:n>, SCK. The plurality of test mode signals include a first test mode control signal BST_SFTB, a second test mode control signal BST_OEB and a test clock signal BST_SCK.

The input buffer 700 may be configured to transmit the serial data received via the serial data input pad SDI to the test unit 301.

The output buffer 800 may be configured to transmit the data generated by the test unit 201 to the serial data output pad SDO.

The plurality of test units 201, 301 may be configured to transmit the internally generated test patterns TD<0:n> to the other slices via the plurality of command/address pads CA and the data input/output pads DQ<0:n> in response to a self test mode signal TMEN.

The plurality of test units 201, 301 may be configured to compare an input signal DIN received via the plurality of command/address pads CA and via the data input/output pads DQ<0:n>. A test pattern is received at the plurality of test units 201, 301 from another slice and the test patterns TD<0:n> are generated in the slice including the plurality of test units 201, 301 based on the self test mode signal TMEN. A test determination value is generated as an output signal DOUT.

The plurality of test units 201, 301 may be configured to store the output signal DOUT and to transmit the output signal DOUT to an external device in response to the first test mode control signal BST_SFTB and the test clock signal BST_SCK.

Each of the plurality of test units 201 may include an input buffer 210, an output buffer 240, a first multiplexer 220, a second multiplexer 250, a flip-flop 230, a third multiplexer 270, and a determining section 280.

The input buffer 210 may be configured to transmit the input signal DIN received via the data input/output pad DQ to the determining section 280. The input buffer 210 is configured to receive the input signal DIN from another slice.

The determining section 280 may be configured to compare the input signal DIN with each of the test patterns TD<m:n> internally generated at the slice including the determining section 280 based on an activated self test mode signal TMEN. The determining section 280 generates a test determination value as the output signal DOUT. The input signal DIN is a test pattern received from another slice, The determining section 280 may be configured to generate the received input signal DIN as the output signal DOUT when the self test mode signal TMEN is deactivated.

In a normal operation mode, the output of the determining section 280 may be transmitted as normal mode reception data NRM RX data to an internal circuit configuration (not shown).

The first multiplexer 220 may be configured to select one of the output signal of the flip-flop 230 and the output signal of the determining section 280 in response to the first test mode control signal BST_SFTB.

The flip-flop 230 may be configured to store the output of the first multiplexer 220 in response to the test clock signal BST_SCK, and to shift or transmit the output of the first multiplexer 220 to a lower test unit 201.

The second multiplexer 250 may be configured to select one of the output generated by the flip-flop 230 and the normal mode transmission data (read data) NRM TX data in response to the second test mode control signal BST_OEB, and to transmit the selected one of the output of the flip-flop 230 and the normal mode transmission data (read data) NRM TX data to the third multiplexer 270.

The third multiplexer 270 may be configured to select one of the output generated by the second multiplexer 250 and each of the test patterns TD<m:n> generated in a slice including the third multiplexer 270 and to transmit the selected one of the output of the second multiplexer 250 and each of the test patterns TD<m:n> to the output buffer 240.

The output buffer 240 may be configured to transmit the output signal generated by the third multiplexer 270 to the data input/output pad DQ.

Each of the plurality of test units 201 may include an input buffer 210, an output buffer 240, a first multiplexer 220, a flip-flop 230, a second multiplexer 250, a third multiplexer 270, and a determining section 280.

The test unit 301 is electrically coupled to the command/address pad CA. Since the plurality of slices Slice0-Slice3 may not transmit commands/addresses to an external device, the test unit 301 may not include a second multiplexer 250.

Each of the plurality of test units 301 may include an input buffer 210, an output buffer 240, a first multiplexer 220, a flip-flop 230, a third multiplexer 270, and a determining section 280.

The input buffer 210 may be configured to transmit the input signal received via the command/address pad CA to the determining section 280.

In a normal operation mode, the output generated by the input buffer 210 may be transmitted as normal mode reception data NRM RX data to an internal circuit configuration (not shown). The output generated by the input buffer 210 is a command/address. The determining section 280 may be configured to compare the input signal DIN received via the plurality of data input/output pads DQ<0:n>and each of the test patterns TD<0:m−1> generated in the slice including the determining section 280 in response to the self test mode signal TMEN. The determining section 280 may be configured to generate a test determination value as the output signal DOUT. The input signal DIN received via the plurality of data input/output pads DQ<0:n> is a test pattern received from another slice.

The first multiplexer 220 may be configured to select one of the output generated by the input buffer 700 and the output generated by the determining section 280 in response to the first test mode control signal BST_SFTB.

The flip-flop 230 may be configured to store the output of the first multiplexer 220 in response to the test clock signal BST_SCK and to shift or transmit the output of the first multiplexer 220 to a lower test unit 201.

The third multiplexer 270 may be configured to select one of the output generated by the flip-flop 230 and each of the test patterns TD<0:m−1> generated in the slice including the third multiplexer 270 and transmit the selected one of the output generated by the flip-flop 230 and each of the test patterns TD<0:m−1> to the output buffer 240.

The output buffer 240 may be configured to transmit the output generated by the third multiplexer 270 to the command/address pad CA.

Figure 4:
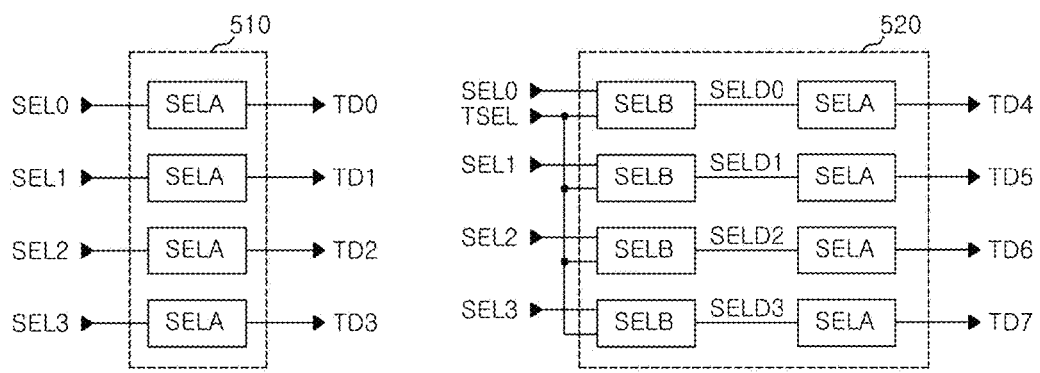
FIG. 4 is a block diagram representation of the pattern generator shown in FIG. 3.

As shown in FIG. 4, the pattern generator 501 may include a first pattern generating section 510 and a second pattern generating section 520.

In an embodiment, the pattern generator 501 may be configured to generate eight test patterns TD<0:7>. The first pattern generating section 510 may be configured to generate a first set of test patterns TD<0:3> in response to a set of first pattern select signals SEL<0:3>.

The first pattern generating section 510 may include a plurality of first pattern generation parts SELA.

The second pattern generating section 520 may be configured to generate a second set of test patterns TD<4:7> in response to the first pattern select signals SEL<0:3> and the second pattern select signal TSEL. The second set of test patterns are the remaining test patterns that are not included in the first set of test is patterns.

The second pattern generating section 520 may include a plurality of first pattern generation parts SELA and a plurality of second pattern generation parts SELB.

The first pattern select signals SEL<0:3> and the second pattern select signal TSEL may be generated in a test mode.

The pattern generator (PG) 501 may generate different types of the test patterns TD<0:n> based on a combination of the first pattern select signals SEL<0:3> and the second pattern select signal TSEL.

Figure 5:
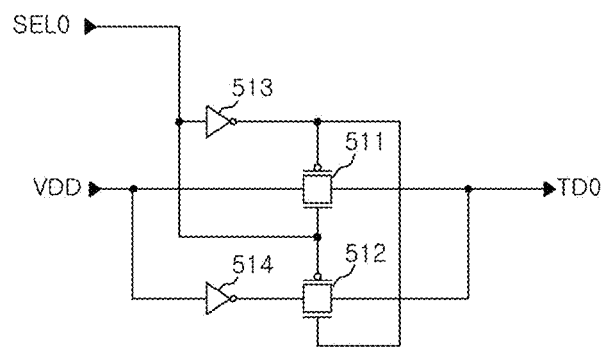
FIG. 5 is a circuit diagram representation of the first pattern generation part shown in FIG. 4.

As shown in FIG. 5, the first pattern generation part SELA may include a plurality of transmission gates 511, 512, and a plurality of inverters 513, 514.

The first pattern generation part SELA may be configured to generate the test pattern TD0 having one of the level of a power supply voltage VDD and the level of a ground voltage (VSS) based on the value of the first pattern select signal SEL0.

Figure 6:
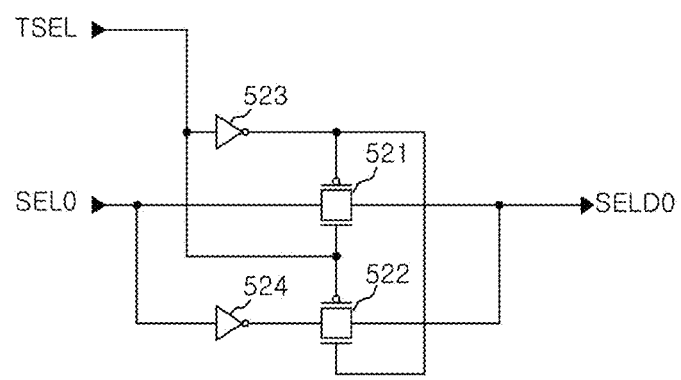
FIG. 6 is a circuit diagram representation of the second pattern generation part shown in FIG. 4.

As shown in FIG. 6, the second pattern generation part SELB may include a plurality of transmission gates 521, 522 and a plurality of inverters 523, 524.

The second pattern generation part SELB may be configured to generate the first pattern select signal SEL0 or an inverted first pattern select signal SEL0 as an output signal SELD0 based on the value of the second pattern select signal TSEL.

Figure 7:
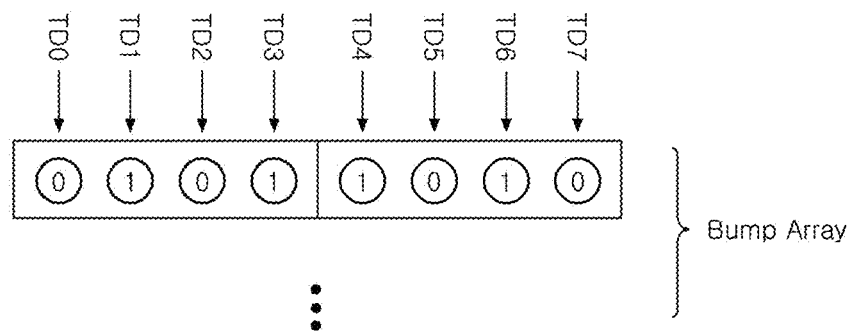
FIG. 7 is a diagram of a data pattern application example of the bump array shown in FIG. 3.

As shown in FIG. 7, a bump array may be electrically coupled to the plurality of command/address pads CA and data input/output pads DQ<0:n>. The test patterns TD<0:n> (where n is assumed as 7) may be applied to the bump array via the plurality of command/address pads CA and via the data input/output pads DQ<0:n>.

The test patterns TD<0:n> of FIG. 7 are provided for illustration purpose only. Other types of test patterns TD<0:n> may be generated by the generator (PG) 501 based on the combination of the first pattern select signals SEL<0:3> and the second pattern select signal TSEL.

Figure 8:
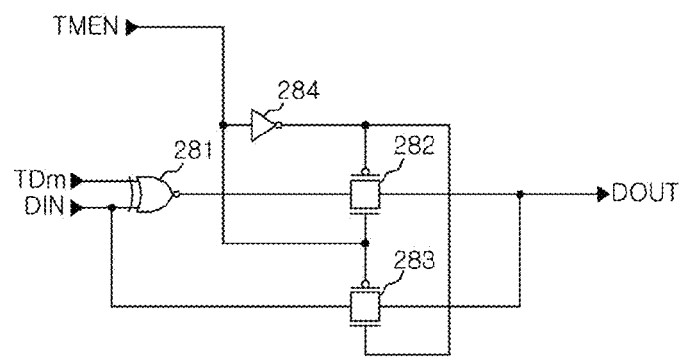
FIG. 8 is a circuit diagram representation of the determining section shown in FIG. 3.

As shown in FIG. 8, the determining section 280 may include an XNOR gate 281, a plurality of transmission gates 282, 283, and an inverter 284.

The determining section 280 may be configured to generate a test determination value based on a comparison of the output signal DIN generated by the input buffer 210 and the test pattern TDm generated in a slice including the determining section 280. The test determination value is generated as the output signal DOUT when the self test mode signal TMEN is activated. The determining section 280 is configured to operate in test mode when the self test mode signal TMEN is activated. When the self test mode signal TMEN is deactivated and the determining section is operating in normal operation mode, the output signal DIN received from the input buffer 210 is a command/address or write data and is transmitted by the determining section 280 as the output signal DOUT.

When the output signal DOUT has, for example, a high level in the test mode, it may be determined that a through-silicon via TSV and a bump Bump electrically coupled to a corresponding pad have passed the test. When the output signal DOUT has, for example, a low level in the test mode, it may be determined that the electrical coupling state of at least one of a through-silicon via TSV and a bump Bump electrically coupled to a corresponding pad has failed the test.

The operations of an embodiment of the test circuit 102 will be described below.

In an embodiment, one of the testing associated with the test mode using the serial data input pad SDI and the testing associated with the self test mode may be selectively performed.

First, the operations associated with the self test mode will be described.

The self test mode signal TMEN is activated upon entering the self test mode.

When the self test mode signal TMEN is activated, one of the plurality of slices Slice0-Slice3, such as for example the lowermost slice Slice0, transmits the test patterns TD<0:n> to the upper slices Slice1-Slice3 via the third multiplexers 270, the output buffers 240 and the plurality of command/address pads CA and data input/output pads DQ<0:n>. The transmitted test patterns TD<0:n> are generated by the pattern generator 501.

Each of the upper slices Slice1-Slice3 receives the test patterns TD<0:n> transmitted by the lowermost slice Slice0 via the plurality of command/address pads CA and data input/output pads DQ<0:n> as input signals DIN via the input buffers 210.

Since the self test mode signal TMEN is in the activated state, each of the upper slices Slice1-Slice3 compares each of the input signals DIN and with each of the test patterns TD<0:n> generated and responsively generates a test determination value as the output signal DOUT. The output signal DOUT has a high level when two of the compared values correspond to each other and a low level when two of the compared values fail to correspond to each other.

Each of the upper slices Slice1-Slice3 stores each of the output signals DOUT in the flip-flop 230 in response to the first test mode control signal BST_SFTB (having for example, a high level) and the test clock signal BST_SCK.

At least one of the upper slices Slice1-Slice3 or all of the upper slices Slice1-Slice3 sequentially shifts the test determination values stored in the flip-flops 230 in response to the first test mode control signal BST_SFTB (having for example, a low level) and the test clock signal BST_SCK and outputs the test determination values via the serial data output pad SDO to an external device. The to external device is a device that is external to the semiconductor apparatus.

When the serial data output pads SDO of the plurality of slices Slice0-Slice3 are individually electrically coupled to a system that is external to the semiconductor apparatus, the upper slices Slice1-Slice3 may substantially simultaneously output the test determination values via the serial data output pads SDO. An example of the system is a memory controller.

When the serial data output pads SDO of the plurality of slices Slice0-Slice3 are commonly electrically coupled to a system that is external to the semiconductor apparatus, a slice selected from the upper slices Slice1-Slice3 may transmit the test determination values via the serial data output pad SDO.

The signal transmitted via the serial data output pad SDO is a test determination value. The test determination value is a test result.

Next, the operations associated with the test mode where the test data is provided from an external device via the serial data input pad SDI will be described below.

In the test mode where the test data is provided via the serial data input pad SDI, the self test mode signal TMEN is deactivated.

When the self test mode signal TMEN is deactivated, the determining section 280 generates the output signal DOUT by bypassing the output signal DIN of the input buffer 210. The third multiplexer 270 selects the output signal generated by the flip-flop 230 and transmits the output signal generated by the flip-flop 230 to the output buffer 240.

The test data received from the external device via the serial data input pad SDI of the lowermost slice Slice0 is stored in the flip-flop 230 of the test unit 301 in accordance with the first test mode control signal BST_SFTB (having for example, the low level) and the test clock signal BST_SCK.

As the test clock signal BST_SCK toggles, the data latched to the flip-flop 230 of the test unit 301 is sequentially transmitted to lower test units 201 and stored in corresponding flip-flops 230 of those lower test units 201.

Upon the completion of the serial test data storage operation associated with storing test data in the flip-flops 230 of the test units 301, 201, a parallel test data generation operation is performed.

The parallel test data generation operation involves the transmission of data stored in the flip-flops 230 of the lowermost slice Slice0, to the upper slices Slice1-Slice3 via the plurality of command/address pads CA and data input/output pads DQ<0:n>.

The test data stored in the flip-flops 230 of the lowermost slice Slice0 are transmitted to the upper slices Slice1-Slice3 via the plurality of command/address pads CA and data input/output pads DQ<0:n>, the second multiplexers 250, the third multiplexers 270 and the output buffers 240, in accordance with the second test mode control signal BST_OEB.

The upper slices Slice1-Slice3 store the test data received via the plurality of command/address pads CA and data input/output pads DQ<0:n> in the flip-flops 230 in accordance with the first test mode control signal BST_SFTB (having for example, the high level) and the test clock signal BST_SCK.

At least one of the upper slices Slice1-Slice3 or all of the upper slices Slice1-Slice3 sequentially shifts the test data stored in the flip-flops 230 in accordance with the first test mode control signal BST_SFTB (having for example, the low level) and the test clock signal BST_SCK and transmits the test data via the serial data output pad SDO to an external device. The external device is a device that is external to a semiconductor apparatus.

When the serial data output pads SDO of the plurality of slices Slice0-Slice3 are individually electrically coupled to a system (for example, test equipment or a memory controller) that is external to the semiconductor apparatus, the upper slices Slice1-Slice3 may substantially simultaneously transmit the test data via the serial data output pads SDO.

When the serial data output pads SDO of the plurality of slices Slice0-Slice3 are commonly electrically coupled to a system external to the semiconductor apparatus, a slice selected from the upper slices Slice1-Slice3 may transmit the test data via the associated serial data output pad SDO.

Since the system external to the semiconductor apparatus provided the test data, it is possible to determine whether the through-silicon vias TSV and bumps Bump have passed or failed the test based on a comparison of the value of the test data provided to the semiconductor apparatus and the values of the test data received via the serial data output pads SDO.

Figure 9:
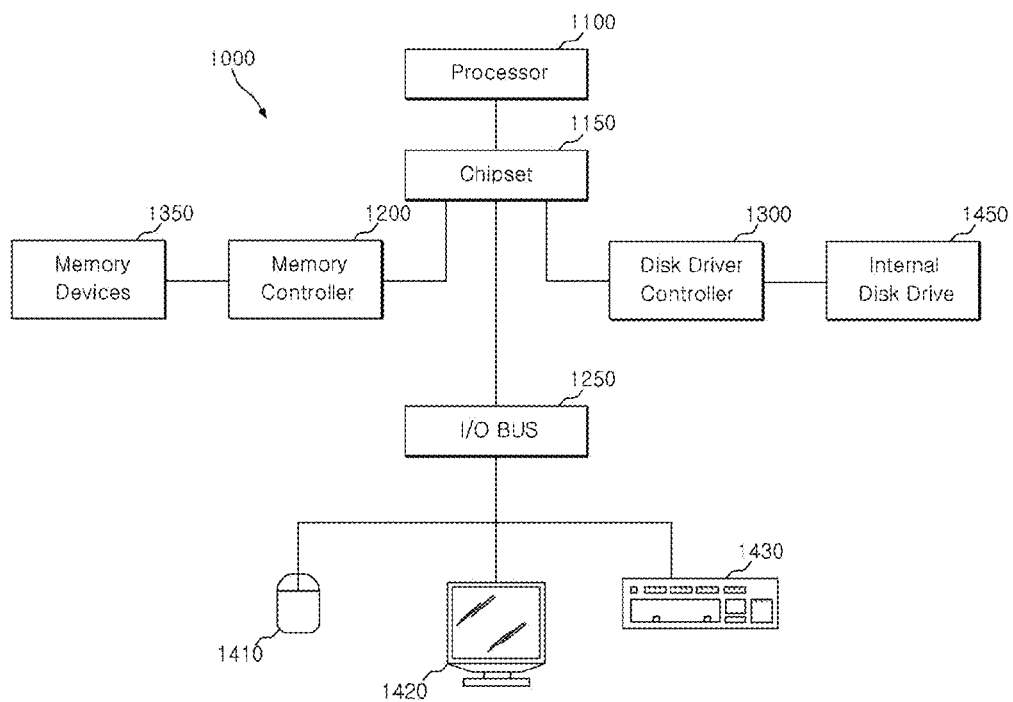
FIG. 9 is a block diagram representation of a system including an embodiment of a semiconductor apparatus including an embodiment of a test circuit.

Referring to FIG. 9, a block diagram representation of a system 1000 including an embodiment of a semiconductor device 1350 is shown. In an embodiment, the semiconductor device 1350 includes an embodiment of the test circuit of a semiconductor apparatus. In an embodiment, the semiconductor device 1350 is a semiconductor apparatus. In an embodiment, the semiconductor device 1350 is a semiconductor memory device. The system 1000 includes one or more semiconductor memory devices 1350 and a memory controller 1200.

In an embodiment, a test circuit of a semiconductor apparatus may include a plurality of pads, a pattern generator configured to generate at least one internal test pattern in response to at least one pattern select signal, and a plurality of test units configured to transmit the at least one internal test pattern through the plurality of pads in response to a self test mode signal, and to compare the at least one test pattern received via the plurality of pads with the at least one generated internal test pattern and generate at least one test determination value based on the comparison.

In an embodiment, a semiconductor apparatus may to include a plurality of slices electrically coupled to one another via a plurality of signal transmission elements, wherein, upon entry to a first test mode, a first one of the plurality of slices is configured to transmit at least one internal test pattern generated at the first one of the plurality of slices to the other plurality of slices through a plurality of pads, and wherein the each of the other plurality of slices is configured to compare the at least one internal test pattern received from the first one of the plurality of slices with at least one of the test patterns generated internally at that slice, to generate at least one test determination value and to transmit the at least one test determination value to an external system.

Examples of the semiconductor memory device 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the is configuration of the system 1000, any one of a number of different signals may be transmitted through the chipset 1150, and those skilled in the art will appreciate that the routing of the signals throughout the system 1000 can be readily adjusted without changing the underlying nature of the system.

The memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more memory devices 1350. The memory devices 1350 may be any one of a number of industry standard memory types, including but not limited to, single inline memory modules ("SIMMs") and dual inline memory modules ("DIMMs"). The memory devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. The I/O bus 1250 may be integrated into the chipset 1150.

The disk drive controller 1450 may also be electrically coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 9 is merely one example of a system employing a semiconductor memory device 1350. In alternate embodiments, such as cellular phones or digital cameras, the components may differ from the embodiment shown in FIG. 9.

While certain embodiments have been described above, it will be understood to those skilled in the art that the embodiments described are by way of example only. Accordingly, the test circuit and the semiconductor apparatus including the same described herein should not be limited based on the described embodiments. Rather, the test circuit and the semiconductor apparatus including the same described herein should only be limited in light of the claims that follow when taken in conjunction with the above description and accompanying drawings.

what is claimed is:

1. A test circuit of a semiconductor apparatus comprising:
   a plurality of pads;
   a pattern generator that generates at least one internal test pattern in response to at least one pattern select signal; and
   a plurality of test units that transmit the at least one internal test pattern through the plurality of pads in response to a self test mode signal, compare the at least one test pattern received via the plurality of pads with the at least one generated internal test pattern and generate at least one test determination value based on the comparison,
   wherein the plurality of test units comprise:
   determining sections that compare the at least one test pattern received via the plurality of pads and the at least one internal test pattern generated in accordance with the self test mode signal, and generate the at least one test determination value based on the comparison;
   at least one first multiplexer that selects one of an output signal of one of an upper test unit and an output signal of at least one of the determining sections in response to a first test mode control signal;
   at least one flip-flop that stores an output of at least one of the first multiplexers and transmits the output to a lower test unit;
   at least one second multiplexer that selects one of an output signal of at least one of the flip-flops and normal mode transmission data in response to a second test mode control signal; and
   at least one third multiplexer that selects one of an output signal of at least one of the second multiplexers and the internal test patterns and transmits the selected one of the output signal of at least one of the second multiplexers and the internal test patterns to the plurality of pads.

2. The test circuit according to claim 1, wherein the plurality of pads comprises command/address pads and data input/output pads.

3. The test circuit according to claim 1, wherein the pattern generator comprises:
   a first pattern generating section that generates a subset of the at least one internal test patterns in response to a first pattern select signal; and
   a second pattern generating section that generates a remainder of the at least one internal test patterns in response to the first pattern select signal and a second pattern select signal.

4. The test circuit according to claim 1, wherein the plurality of test units store the at least one test determination value and transmit the at least one test determination value to an external device in response to a test mode control signal.

5. The test circuit according to claim 4, further comprising:
   a mode generator that generates the test mode control signal in response to at least one external signal received from an external device via at least one of the plurality of pads.

6. A semiconductor apparatus comprising:
a plurality of stacked chips electrically coupled to one another by a plurality of TSV(through silicon via),
wherein, upon entry to a first test mode, a first one of the plurality of stacked chips transmit at least one internal test pattern generated at the first one of the plurality of stacked chips to the other plurality of stacked chips through a plurality of pads,
wherein, each one of the other plurality of stacked chips compare the at least one internal test pattern received from the first one of the plurality of stacked chips with at least one test pattern generated internally at that chip, generate at least one test determination value and transmit the at least one test determination value to an external system of the semiconductor apparatus,
wherein each of the plurality of stacked chips comprises:
the plurality of pads;
a pattern generator that generates the at least one internal test pattern in response to at least one pattern select signal; and
a plurality of test units that transmit the at least one internal test pattern through the plurality of pads in response to a self test mode signal, and compare the at least one internal test pattern received via the plurality of pads with the at least one internal test pattern generated internally at that chip and generate at least one test determination value based on the comparison, and
wherein the plurality of test units comprise:
determining sections that compare the at least one test pattern received via the plurality of pads and the at least one internal test pattern generated in accordance with the self test mode signal, and generate the at least one test determination value;
at least one first multiplexer that selects one of an output signal of one of an upper test units and an output signal of at least one of the determining sections in response to a first test mode control signal;
at least one flip-flop that stores an output of the at least one first multiplexer and to transmit the output to a lower test unit; and
at least one second multiplexer that selects one of an output signal of at least one of the flip-flops and normal mode transmission data in response to a second test mode control signal; and
at least one third multiplexer that selects one of an output signal of the at least one second multiplexer and the at least one internal test pattern and transmits the selected one of the output signal of the at least one second multiplexer and the at least one internal test pattern to the plurality of pads.

7. The semiconductor apparatus according to claim 6, wherein the plurality of pads are electrically coupled to the plurality of TSV.

8. The semiconductor apparatus according to claim 6, wherein the plurality of TSV further comprise bump pads, wherein the bump pads are electrically coupled to the plurality of TSV.

9. The semiconductor apparatus according to claim 6, wherein the plurality of pads comprise command/address pads and data input/output pads.

10. The semiconductor apparatus according to claim 6, wherein the pattern generator comprises:

a first pattern generating section that generates a subset of the at least one internal test pattern in response to a first pattern select signal; and
a second pattern generating section that generates a remainder of the at least one internal test pattern in response to the first pattern select signal and a second pattern select signal.

11. The semiconductor apparatus according to claim 6, wherein the plurality of test units transmit the at least one test determination value to an external device in response to a test mode control signal.

12. The semiconductor apparatus according to claim 11, further comprising:
a mode generator that generates the test mode control signal in response to at least one external signal received from the external device via at least one of the plurality of pads.

13. The semiconductor apparatus according to claim 6, wherein the plurality of stacked chips that selectively output the at least one test determination value or substantially simultaneously output the at least one test determination value.

14. The semiconductor apparatus according to claim 6,
wherein each of the plurality of stacked chips comprises a serial data input pad and a serial data output pad, and selectively performs the first test mode and a second test mode,
wherein, in the second test mode, a first one of the plurality of stacked chips receives test data from the external system via the serial data input pad, and transmits the test data to the other chips in the plurality of stacked chips through the plurality of pads, and
wherein the each of the other chips in the plurality of stacked chips transmits the test data to the external system via the serial data output pad associated with that chip.

15. The semiconductor apparatus according to claim 14, wherein the plurality of stacked chips serially transmit the test data or substantially simultaneously transmit the test data.

16. A test circuit of a semiconductor apparatus comprising:
a pattern generator that generates at least one internal test pattern;
determining sections that compare the at least one test pattern received via a plurality of pads and the at least one internal test pattern generated in accordance with a self test mode signal, and generate an at least one test determination value based on the comparison;
at least one first multiplexer that selects one of an output signal of one of an upper test unit and an output signal of at least one of the determining sections in response to a first test mode control signal;
at least one second multiplexer that selects one of an output signal of the at least one first multiplexer and normal mode transmission data in response to a second test mode control signal; and
at least one third multiplexer that selects one of an output signal of at least one of the second multiplexers and the internal test patterns and transmits the selected one of the output signal of at least one of the second multiplexers and the internal test patterns to the plurality of pads.

* * * * *